United States Patent
Sha et al.

(10) Patent No.: US 7,029,505 B2
(45) Date of Patent: Apr. 18, 2006

(54) SHEET TYPE HEAT TREATING APPARATUS AND METHOD FOR PROCESSING SEMICONDUCTORS

(75) Inventors: Lin Sha, Tsukui-gun (JP); Shou-Qian Shao, Winchester, MA (US); Yicheng Li, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 224 days.

(21) Appl. No.: 10/466,113

(22) PCT Filed: Nov. 27, 2001

(86) PCT No.: PCT/JP01/10331

§ 371 (c)(1),
(2), (4) Date: Dec. 8, 2003

(87) PCT Pub. No.: WO02/061818

PCT Pub. Date: Aug. 8, 2002

(65) Prior Publication Data

US 2005/0260835 A1    Nov. 24, 2005

(30) Foreign Application Priority Data

Jan. 22, 2001    (JP) .............................. 2001-013832

(51) Int. Cl.
*H01L 21/00* (2006.01)
(52) U.S. Cl. ..................... 29/25.01; 118/723; 118/724; 118/725; 432/103; 432/152; 432/250
(58) Field of Classification Search ............... 29/25.01; 118/723–725; 432/103, 152, 250
See application file for complete search history.

(56) References Cited

U.S. PATENT DOCUMENTS

| | | | | |
|---|---|---|---|---|
| 6,262,397 B1* | 7/2001 | Yazawa | ...................... | 219/411 |
| 6,301,434 B1* | 10/2001 | McDiarmid et al. | ........ | 392/416 |
| 6,893,907 B1* | 5/2005 | Maydan et al. | ............. | 438/149 |
| 2002/0190052 A1* | 12/2002 | Kitamura | .................... | 219/390 |
| 2005/0003600 A1* | 1/2005 | Kasai et al. | ................. | 438/200 |

FOREIGN PATENT DOCUMENTS

| | | |
|---|---|---|
| JP | 2-283022 | 11/1990 |
| JP | 9-153491 | 6/1997 |
| JP | 10-182300 | 7/1998 |
| JP | 2000-77397 | 3/2000 |
| JP | 2002-43299 | 2/2002 |

\* cited by examiner

*Primary Examiner*—George Fourson
*Assistant Examiner*—Thanh V. Pham
(74) *Attorney, Agent, or Firm*—Oblon, Spivak, McClelland, Maier & Neustadt, P.C.

(57) ABSTRACT

The single substrate thermal processing apparatus (2) includes a process chamber (5) arranged to accommodate a target substrate (W) and provided with a showerhead (10) disposed on its ceiling. A support member (28) is disposed to support the target substrate (W) so as for it to face the showerhead (10), when the target substrate (W) is subjected to a semiconductor process. A heating lamp (30) is disposed below the support member (28), for radiating light to heat the target substrate (W). The support member (28) and heating lamp (30) are moved up and down together relative to the showerhead (10) by an elevator mechanism (20). The elevator mechanism (20) sets different distances between the showerhead (30) and heating lamp (10), in accordance with the different process temperatures, thereby causing temperature change of the bottom surface of the showerhead (10) to fall in a predetermined range.

14 Claims, 7 Drawing Sheets

SHEET TYPE HEAT TREATING APPARATUS AND METHOD FOR PROCESSING SEMICONDUCTORS

TECHNICAL FIELD

The present invention relates to a single substrate thermal processing apparatus and method for a semiconductor process, which performs a process such as annealing, film formation, etching, oxidation, or diffusion. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

BACKGROUND ART

In order to manufacture semiconductor devices, film formation and pattern etching are repeatedly applied to a semiconductor wafer. As semiconductor devices are becoming more and more highly miniaturized and integrated, demands on film formation have become stricter. For example, very thin insulating films, such as capacitor insulating films and gate insulating films are required to be even thinner and to achieve a higher insulation performance.

Conventionally, silicon oxide films and silicon nitride films are used as the insulating films. In recent years, however, it has been proposed to form the insulating films from materials having even higher insulating properties, such as a metal oxide, e.g., tantalum oxide ($Ta_2O_5$). A metal oxide film of this kind can be deposited by means of MOCVD (Metal Organic Chemical Vapor Deposition), i.e., using a vaporized metal organic compound. To form a tantalum oxide film by means of MOCVD, a metal alkoxide of tantalum, such as $Ta(OC_2H_5)_5$ (pentoethoxytantalum: PET) is used as a raw material liquid.

The metal oxide film has an insulation property of high reliability even with a small thickness, and can further have a higher insulation property by means of a reformation process performed after the film deposition (Jpn. Pat. Appln. KOKAI Publication No. 2-283022). Conventionally, a tantalum oxide film used as an insulating metal oxide film is formed by the following method.

Specifically, a tantalum oxide ($Ta_2O_5$) film is first deposited on a semiconductor wafer to a predetermined thickness, in a CVD apparatus. For this, the raw material liquid is made to bubble to be in a gaseous state by e.g., nitrogen gas, or vaporized by a vaporizer set at a vaporizing temperature, and is supplied to a process chamber preset to have a vacuum atmosphere. At the same time, an oxidizing gas, such as oxygen, is supplied to the process chamber. The supplied raw material is decomposed to offer a film forming material on the surface of a wafer heated to a process temperature of from about 400 to 500° C. With this film forming material, a tantalum oxide ($Ta_2O_5$) film is formed on the surface of the wafer by means of deposition.

Then, the wafer is transferred into to a reforming apparatus and the tantalum oxide film is reformed in this apparatus. In the case of a UV ozone process, the wafer W is placed in an atmosphere containing ozone ($O_3$), and UV rays emitted from a UV lamp are radiated onto the ozone above the surface of the wafer W. With the reformation process, the energy of the UV rays and activated oxygen atoms cause organic impurities, such as C—C bonds and hydrocarbon, contained in the tantalum oxide film to be cut and dissociated therefrom, thereby reforming the tantalum oxide film. The reformation process temperature is set at, e.g., about 600° C.

Then, the wafer is transferred to a heat-processing apparatus and the tantalum oxide film is crystallized in this apparatus. In this process, an atmosphere containing oxygen gas, and a process temperature, e.g., not lower than 750° C., which is higher than the crystallization temperature of tantalum oxide, are used. With this crystallization annealing process, the tantalum oxide film is compacted in a molecular level, and is planarly uniformed in the film thickness, thereby providing an insulating film having a good insulating property.

On the other hand, in manufacture of semiconductor devices, an increase in throughput is an important object in order to increase the mass productivity. Furthermore, as the cost necessary for maintaining heat-processing apparatuses is very high, it is required to reduce the number of apparatuses to be installed as much as possible. Under the circumstances, it has been proposed to perform the deposition and reformation described above in a single process chamber (Jpn. Pat. Appln. KOKAI Publication Nos. 9-153491 and 10-182300). In this case, however, since there is a substantial difference in process temperature between the deposition and reformation, byproduct films having stuck to the inner surface of the process chamber during deposition likely peel off due to the process temperature difference, and produce floating particles. Particularly, in an apparatus of the type supplying a process gas from a showerhead, byproduct films sticking to the surface of the showerhead easily peel off due to the process temperature difference.

In light of throughput and cost, it is preferable to also perform the crystallization in addition to the deposition and reformation in the same process chamber. However, since the process temperature of the crystallization is still higher than those of the deposition and reformation, the problem described above becomes more prominent and thus hinders this idea from being put into practice.

DISCLOSURE OF INVENTION

An object of the present invention is to provide a single substrate thermal processing apparatus and method, which can prevent byproduct films on a showerhead from peeling off due to process temperature difference.

According to a first aspect of the present invention, there is provided a single substrate thermal processing apparatus for subjecting a target substrate to a plurality of semiconductor processes having different process temperatures, comprising:

a process chamber configured to accommodate a target substrate;

a supply system configured to supply a process gas into the process chamber, the supply system including a showerhead, which is disposed on a ceiling of the process chamber and has a bottom surface with a plurality of spouting holes for spouting a process gas;

an exhaust system configured to vacuum-exhaust the process chamber;

a support member configured to support the target substrate to face the showerhead in the process chamber when the target substrate is subjected to the semiconductor processes;

a heating lamp disposed below the support member, and configured to emit light to heat the target substrate; and an elevator mechanism configured to move the support member and the heating lamp up and down together relative to the showerhead, the elevator mechanism being configured to set different distances between the showerhead and the heating lamp, in accordance with the different process temperatures, thereby causing temperature change of the bottom surface of the showerhead to fall in a predetermined range.

According to a second aspect of the present invention, there is provided a single substrate thermal processing method in the apparatus according to the first aspect, comprising:

performing a first process at a first process temperature while setting a first distance between the showerhead and the heating lamp; and performing a second process at a second process temperature while setting a second distance between the showerhead and the heating lamp, the second distance being larger than the first distance, and the second process temperature being higher than the first process temperature.

According to a third aspect of the present invention, there is provided a single substrate thermal processing apparatus for subjecting a target substrate to a plurality of semiconductor processes having different process temperatures, comprising:

a process chamber configured to accommodate a target substrate;

a supply system configured to supply a process gas into the process chamber, the supply system including a showerhead, which is disposed on a ceiling of the process chamber and has a bottom surface with a plurality of spouting holes for spouting a process gas;

an exhaust system configured to vacuum-exhaust the process chamber;

a support member configured to support the target substrate to face the showerhead in the process chamber when the target substrate is subjected to the semiconductor processes;

a heating lamp disposed below the support member, and configured to emit light to heat the target substrate; and an elevator mechanism configured to move the support member up and down, the elevator mechanism being configured to set different distances between the target substrate and the heating lamp, in accordance with the different process temperatures, thereby causing temperature change of the bottom surface of the showerhead to fall in a predetermined range.

According to a fourth aspect of the present invention, there is provided a single substrate thermal processing method in the apparatus according to the third aspect, comprising:

performing a first process at a first process temperature while setting a first distance between the target substrate and the heating lamp; and performing a second process at a second process temperature while setting a second distance between the target substrate and the heating lamp, the second distance being smaller than the first distance, and the second process temperature being higher than the first process temperature, wherein, in the first and second processes, the showerhead and the heating lamp are maintained to have a constant distance therebetween.

BEST MODE FOR CARRYING OUT THE INVENTION

Figure 1:
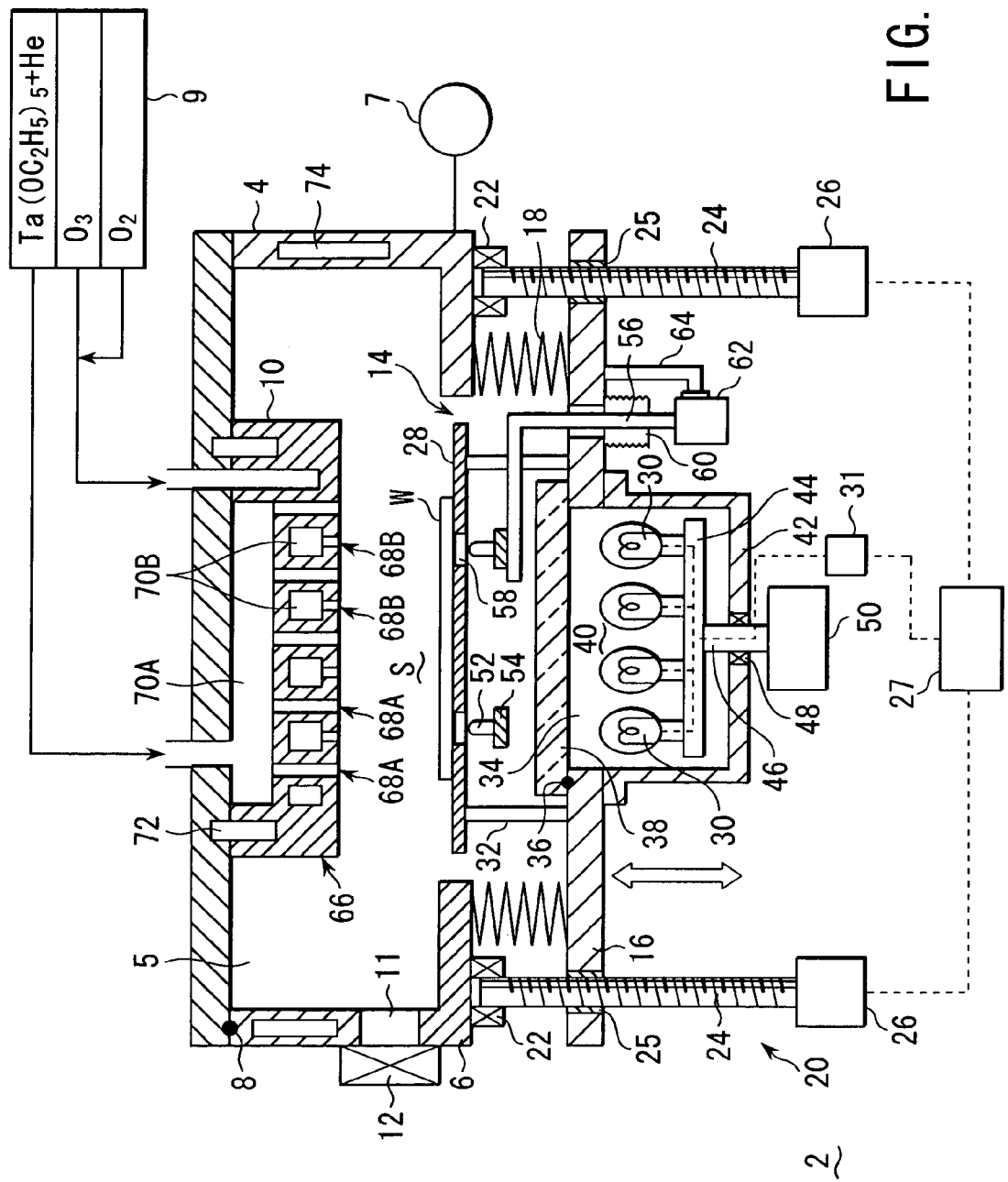
FIG. 1 is a structural diagram showing a single wafer thermal processing apparatus for a semiconductor process according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a structural diagram showing a single wafer thermal processing apparatus for a semiconductor process according to an embodiment of the present invention. This apparatus is arranged to deposit a tantalum oxide film or metal oxide film by means of CVD, and further reform and crystallize the film. In the following explanation, "low temperature thermal process", "middle temperature thermal process" and "high temperature thermal process" do not mean concrete values in temperature, but denote thermal relationships between the processes.

As shown in FIG. 1, the heat-processing apparatus 2 has a process container 4 formed of, e.g., an aluminum cylinder, in which a process chamber 5 is formed. The bottom 6 of the process container 4 is connected to an exhaust section 7 through an exhaust port (not shown), for vacuum-exhausting the interior of the process chamber 5. A showerhead 10 is disposed along with a sealing member 8, such as an O-ring, on the ceiling of the process container 4. The showerhead 10 is connected to a gas supply section 9, for supplying various kinds of process gases into the process chamber 5. A port 11 is formed in the sidewall of the process container 4, and is opened/closed by a gate valve 12. A semiconductor wafer W or target substrate is transferred through the port 11 into or from the process chamber 5.

A circular opening 14 having a large diameter is formed at the center of the bottom 6 of the process container 4. A bottom plate 16 is disposed below the opening 14 to cover the opening 14 and to be movable up and down relative to the process container 4. A metal bellows 18, which has a large diameter and is extensible/contractible, is airtightly connected between the bottom surface of the container bottom 6 and the top surface of the bottom plate 16, and surrounds the opening 14. The bellows 18 ensures that the interior of the process chamber 5 is airtight, while allowing the bottom plate 16 to be movable up and down.

The bottom of the process container 4 is provided with an elevator mechanism 20 formed of a ball-screw mechanism for moving the bottom plate 16 up and down. The elevator mechanism 20 has a plurality of vertical screw shafts 24, the top of each of which is rotatably supported by a bearing 22 on the container bottom 6. Although FIG. 1 shows only two screw shafts 24, there are three of more, e.g., three, shafts essentially equidistantly disposed in an angular direction, in fact. A ball-screw nut 25 is fixed to the bottom plate 16 at the place where each screw shaft 24 penetrates the bottom plate 16. The bottom plate 16 is vertically moved (moved up and down) by bi-directionally rotating the screw shafts 24 in synchronization.

The lower ends of the screw shafts 24 are respectively connected to motors 26 for bi-directionally rotating the screw shafts 24. The motors 26 are fixed to a fixation base (not shown). The motors 26 are driven under the control of a controller 27. The screw shafts 24 may share one common motor 26, while belts or the like are looped over the motor 26 and screw shafts 24 to bi-directionally rotate the belts in synchronization.

The bottom plate 16 is provided with a worktable 28 used as a support member for supporting the wafer W, and heating lamps 30 for heating the wafer W. For example, a plurality of struts 32 extend upward from the top surface of the bottom plate 16, and support at their tops the worktable 28, which is formed of a thin plate of a ceramic, such as a carbon based material or AlN. The worktable 28 has a diameter larger than that of the wafer W, so that it comes in contact with essentially the entire bottom surface of the wafer W. The diameter of the worktable 28 is set slightly smaller than that of the opening 14, so that it can move up and down through the opening 14. In place of the struts 32, a cylindrical reflector with a reflecting inner surface may be used to support the worktable 28 on the top.

An opening 34 is formed in the bottom plate 16 at a position directly below the worktable 28. The opening 34 is airtightly closed by a thick transmitting window 38 formed of, e.g., quartz glass, with a sealing member 36, such as an O-ring, sandwiched therebetween. A partition wall 42 is connected to the bottom surface of the bottom plate 16 to form a box-like heating chamber 40 surrounding the transmitting window 38 from below. The heating means or heating lamps 30 are attached to a turntable 44, which also functions as a reflecting mirror, in the heating chamber 40. The rotational shaft 46 of the turntable 44 penetrates the bottom of the heating chamber 40 through a bearing 48, and is connected to a rotary motor 50 disposed below the heating chamber 40. Heat rays emitted from the heating lamps 30 pass through the transmitting window 38 and are radiated onto the bottom surface of the worktable 28 to heat the wafer W. The power supply 31 of the heating lamps 30 is driven under the control of the controller 27.

A plurality of, e.g., three, vertical lifter pins 52 made of quartz are disposed below the worktable 28 (only two of them are shown in FIG. 1). The lifter pins 52 can project upward from lifter holes 58 formed in the worktable 28, and support the wafer W. The lifter pins 52 are connected to each other at their bottom by, e.g., an annular connection member 54 made of quartz, so that they are moved up and down together. The connection member 54 is fixed to the top of an elevator rod 56, which vertically extends through the bottom plate 16. Where the elevator rod 56 moves up and down, the lifter pins 52 are moved up and down relative to the worktable 28 to assist load and unload of wafer W relative to the worktable 28.

An extensible/contractible bellows 60 is disposed at the portion where the elevator rod 56 penetrates the bottom plate 6 to ensure that the interior of the process chamber 5 is airtight. The bottom end of the elevator rod 56 is connected to an actuator 62 for moving the rod 56 up and down. The actuator 62 is fixed to the bottom plate 16 by an attachment 64. Accordingly, the worktable 28, heating lamps 30, transmitting window 38, lifter pins 52, and so forth, which are supported by the bottom plate 16, are moved up and down together, along with the bottom plate 16 being moved up and down.

The showerhead 10 faces the top surface of the worktable 28 entirely thereover, so that a process space S is formed between the showerhead 10 and worktable 28. The showerhead 10 has a bottom surface 66 in which a number of spouting holes 68A and 68B are formed to spout gases. Process gases from the gas supply section 9, such as metal organic gas and oxygen for deposition, ozone for reformation, and oxygen for crystallization, are supplied into the process chamber 5 from the spouting holes 68A and 68B.

The interior of the showerhead 10 is divided into a head space 70A for a raw material gas, and a head space 70B for another gas. The head space 70A is fed, at a controlled flow rate, with a vaporized metal organic raw material, such as metal alkoxide (e.g., PET: pentoethoxytantalum: $Ta(OC_2H_5)_5$), which has been vaporized by an inactive carrier gas, such as helium. The head space 70B is fed with oxygen, ozone ($O_3$), or the like selectively or together, at a controlled flow rate.

The spouting holes 68A communicate with the head space 70A for a raw material gas. The spouting holes 68B communicate with the head space 70B for another gas. The raw material gas and other gas spouted from the spouting holes 68A and 68B are mixed in the process space S, i.e., they are supplied in a post-mixture manner. The gas supply manner is not limited to post-mixture, and may be performed by pre-mixing the gases in the showerhead. In reformation or crystallization, ozone or oxygen is supplied from the spouting holes 68B, but no raw material gas is supplied from the spouting holes 68A.

The showerhead 10 is provided with a cooling jacket 72 formed in the sidewall. The cooling jacket 72 is fed with a coolant of about 60° C., such as warm water. With the coolant, the sidewall of the showerhead 10 is maintained at, e.g., about 140 to 175° C., to prevent the raw material gas from being decomposed by heat at this location. The process container 4 is also provided with a cooling jacket 74 formed in the sidewall. The cooling jacket 74 is also fed with a coolant of about 60° C., such as warm water. With the coolant, the sidewall of the process container 4 is maintained at, e.g., about 140 to 175° C., to prevent the raw material gas from being decomposed by heat at this location, or from being liquefied by cold at this location.

An explanation will be given, with reference to FIGS. 2A to 2C and 3, of a single wafer thermal processing method according to an embodiment of the present invention, which is performed, using the heat-processing apparatus shown in FIG. 1.

Figure 2A:
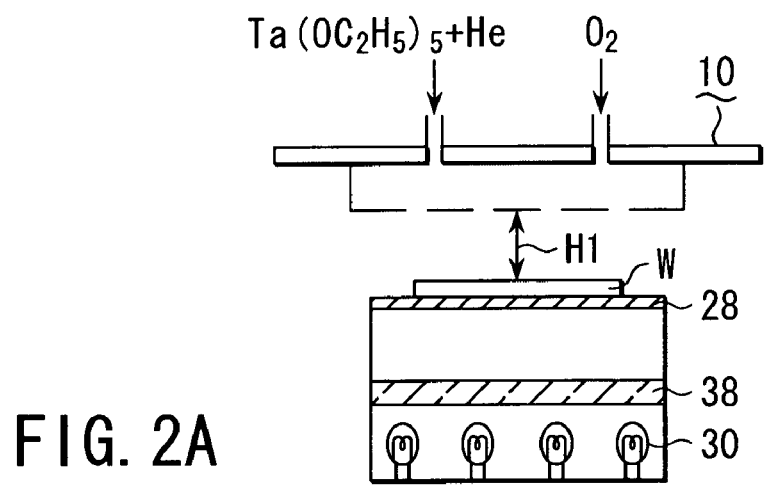
FIG. 2A to FIG. 2C are schematic diagrams showing the relationship between thermal processes having different process temperatures (wafer temperatures) and the positions of a worktable and heating lamps relative to a showerhead, in the apparatus shown in FIG. 1.
Figure 2B:
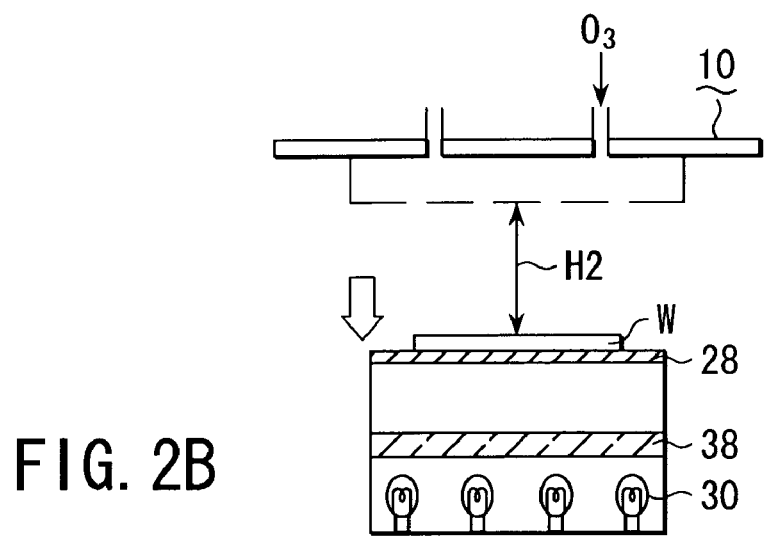
Figure 2C:
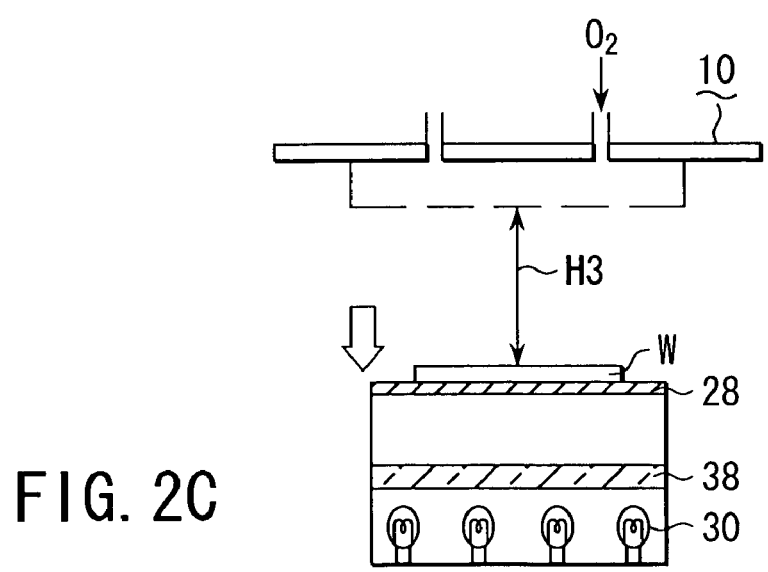
Figure 3:
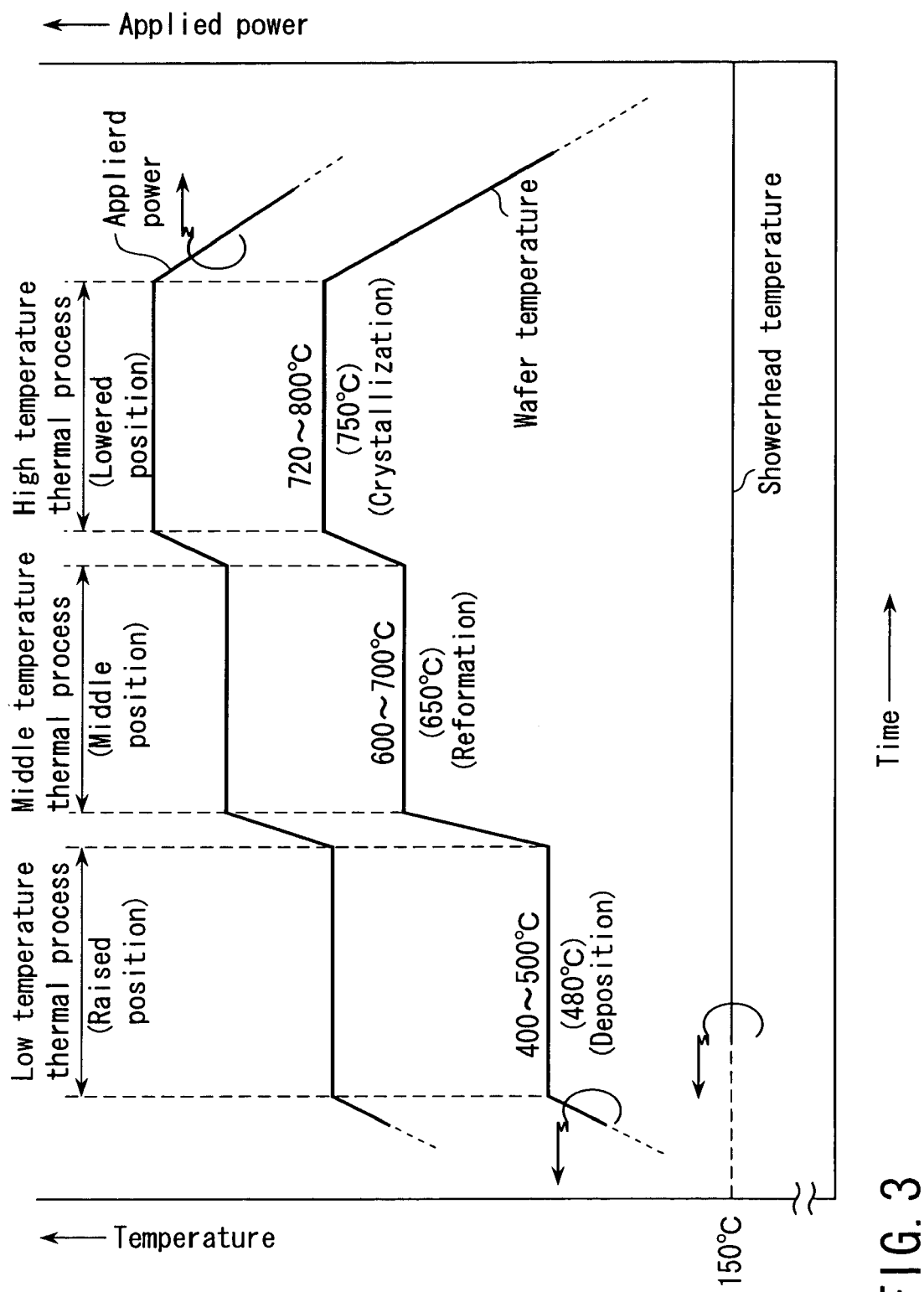
FIG. 3 is a graph showing the relationship between thermal processes having different process temperatures (wafer temperatures) and the applied power to heating lamps, in the apparatus shown in FIG. 1.

FIG. 2A to FIG. 2C are schematic diagrams showing the relationship between thermal processes having different process temperatures (wafer temperatures) and the positions of the worktable and heating lamps relative to the showerhead, in the apparatus shown in FIG. 1. FIG. 3 is a graph showing the relationship between the thermal processes having different process temperatures (wafer temperatures) and the applied power to the heating lamps, in the apparatus shown in FIG. 1.

In the single wafer thermal processing method, the worktable 28 and heating lamps 30 are moved up and down together relative to the showerhead 10, and, at different height positions, thermal processes having different process temperatures are performed. In other words, different distances are preset between the showerhead 10 and heating lamps 30, corresponding to different process temperatures. This is conceived to allow the temperature change on the surface of the showerhead 10 (the bottom and side surfaces) due to the different process temperatures to fall within a predetermined range, and preferably, to minimize it.

Specifically, as shown in FIG. 2A, the worktable 28 is placed at a raised position to perform deposition (a low temperature thermal process) for depositing a tantalum oxide film on the wafer W. As shown in FIG. 2B, the worktable 28 is placed at a middle position to perform reformation (a middle temperature thermal process) for reforming the tantalum oxide film. As shown in FIG. 2C, the worktable 28 is placed at a lowered position to perform crystallization (a high temperature thermal process) for crystallizing the tantalum oxide film.

<Low Temperature Thermal Process (Deposition)>

First, a new semiconductor wafer W is transferred by a transfer arm (not shown) from a transfer chamber or load-lock chamber (not shown) into the process chamber 5 through the port 11. The wafer W is placed on the worktable 28 by means of assistance of the lifter pins 52 moving up and down.

Then, under the control of the controller 27, the bottom plate 16 is moved up by the elevator mechanism 20, so that the worktable 28, transmitting window 38, heating lamps 30, and so forth are moved up together. Then, as shown in FIG. 2A, the distance between the showerhead 10 and worktable 28 is set at H1, which is a predetermined value. The position of the worktable 28 at this time is named the raised position.

Then, under the control of the controller 27, the heating lamps 30 is driven to heat the semiconductor wafer W to a predetermined temperature and maintain it at that temperature. On the other hand, a raw material gas and $O_2$ gas are supplied from the showerhead 10 into the process space S, while the process chamber 5 is vacuum-exhausted to maintain it at a predetermined process pressure. In this state, deposition of a tantalum oxide film is performed.

Since PET (pentoethoxytantalum: $Ta(OC_2H_5)_5$) is a liquid raw material, it is supplied after being vaporized by a vaporizer. This supply system is heated at a predetermined temperature of, e.g., about 160° C., to prevent the raw material gas from being liquefied again. The raw material gas is supplied from the head space 70A of the showerhead 10 through the spouting holes 68A into the process space S. The $O_2$ gas is supplied from the head space 70B of the showerhead 10 through the spouting holes 68B into the process space S. The raw material gas and $O_2$ gas are mixed and react with each other in the process space S, and a tantalum oxide film ($Ta_2O_5$) is deposited on the wafer surface.

The deposition process temperature, i.e., the wafer temperature, is set to fall within a range of from 400 to 500° C., and e.g., at about 480° C. The distance H1 between the showerhead 10 and worktable 28 is set at, e.g., about 1.5 to 2.5 cm. At this time, the surface temperature of the showerhead 10 is, e.g., about 150° C.

The distance H1 between the showerhead 10 and worktable 28 is very small, and thus they are positioned close to each other. Accordingly, the raw material gas can effectively contribute to deposition reaction, thereby efficiently performing the deposition. The distance H1 is set such that the surface of the showerhead 10 has a temperature, such as 150° C., for preventing a byproduct film from sticking thereto. For this reason, the distance H1 is preset in consideration of the cooling performance of the cooling jacket 72 in the showerhead 10, and the deposition process temperature, i.e., the wafer W temperature. It should be noted, however, that although the showerhead 10 is cooled, a slight byproduct film is inevitably deposited on the surface of the showerhead 10 in deposition.

As described above, the deposition is performed for a predetermined time to deposit a tantalum oxide film of a predetermined film thickness, and then the raw material gas and oxygen ($O_2$) supply is stopped. Next, the mode shifts to reformation, i.e., the middle temperature thermal process.

<Middle Temperature Thermal Process (Reformation)>

First, as shown in FIG. 3, under the control of the controller 27, the applied power to the heating lamps 30 is increased, to raise the temperature of the wafer W in a short time up to a predetermined temperature of, e.g., 650° C., which falls within the reformation process temperature of 600 to 700° C. If the position of the worktable 28 remains stationary at this time, the surface temperature of the showerhead 10 will increase, although the cooling jacket 72 cools the showerhead 10. In order to prevent the surface temperature of the showerhead 10 from increasing, and thus to maintain it at, e.g., about 150° C., the bottom plate 16 is moved down by the elevator mechanism 20 under the control of the controller 27. By doing so, as shown in FIG. 2B, the distance between the showerhead 10 and worktable 28 is increased to H2. The distance H2 is determined in accordance with process conditions for the reformation, and is preferably set at, e.g., about 7 to 10 cm. The position of the worktable 28 at this time is named the middle position.

Then, the wafer W is maintained at the reformation process temperature, and ozone ($O_3$) is supplied from the showerhead 10, while the process chamber 5 is vacuum-exhausted to maintain it at a predetermined process pressure. In this state, reformation of the tantalum oxide film is performed. The ozone can be generated by, e.g., an ozone generator (not shown). The ozone may be supplied not from the showerhead 10, but from a nozzle independently disposed on the sidewall or the like of the process container 4. A large amount of activated oxygen atoms are produced by the agency of the supplied ozone. By doing so, a sufficient amount of oxygen is supplied into the tantalum oxide film on the wafer surface to reform the tantalum oxide film.

The reformation process pressure in the process chamber 5 is set to fall within a range of 133 to 79800 Pa (1 to 600 Torr). At a pressure out of this range, progress of the reformation is slow or not sufficient, thereby lowering the dielectric breakdown voltage of the tantalum oxide film.

The reformation process temperature, i.e., the wafer W temperature, is set at a temperature lower than the crystallization temperature of the tantalum oxide film, and, for example, to fall within a range of from 600 to 700° C. Where the wafer temperature is lower than 600° C., the dielectric breakdown voltage is not sufficient. On the other hand, where the wafer temperature is higher than 700° C., crystallization proceeds and hinders a sufficient reformation, because the metal crystallization temperature is about 720 to 800° C.

In the reformation, UV radiation may be performed along with the operation described above, thereby improving the reformation efficiency.

Since the reformation is performed as described above, hardly any change is caused in the surface temperature of the showerhead 10 between the deposition and reformation. Accordingly, byproduct films on the showerhead do not peel off due to thermal expansion/contraction, thereby hardly producing any particles. In this respect, according to the conventional apparatus, byproduct films on the showerhead peel off due to thermal expansion/contraction, thereby causing particle contamination.

As described above, the reformation is performed for a predetermined time, and then the ozone supply is stopped. Next, the mode shifts to crystallization, i.e., the high temperature thermal process.

<High Temperature Thermal Process (Crystallization)>

First, as shown in FIG. 3, under the control of the controller 27, the applied power to the heating lamps 30 is further increased, to raise the temperature of the wafer W in a short time up to a predetermined temperature of, e.g., 750° C., which falls within the crystallization process temperature of 720 to 800° C. If the position of the worktable 28 remains stationary at this time, the surface temperature of the showerhead 10 will increase, although the cooling jacket 72 cools the showerhead 10. In order to prevent the surface temperature of the showerhead 10 from increasing, and thus to maintain it at, e.g., about 150° C., the bottom plate 16 is further moved down by the elevator mechanism 20 under the control of the controller 27. By doing so, as shown in FIG. 2C, the distance between the showerhead 10 and worktable 28 is increased to H3. The distance H3 is determined in accordance with process conditions for the crystallization, and is preferably set at, e.g., about 10 to 15 cm. The position of the worktable 28 at this time is named the lowered position.

Then, the wafer W is maintained at the crystallization process temperature, and oxygen ($O_2$) is supplied from the showerhead 10, while the process chamber 5 is vacuum-exhausted to maintain it at a predetermined process pressure. In this state, crystallization of the tantalum oxide film is performed. By crystallizing the reformed tantalum oxide film, it is possible to obtain an insulating film having better electric properties.

Since the crystallization is performed as described above, hardly any change is caused in the surface temperature of the showerhead 10 between the deposition, reformation, and crystallization. Accordingly, byproduct films on the showerhead do not peel off due to thermal expansion/contraction, thereby hardly producing any particles.

After serial processes of the deposition, reformation, and crystallization are completed on the semiconductor wafer W, the same processes as described above are repeated on each of the new wafers. In other words, a number of wafers are continuously subjected to the tantalum oxide film formation.

As described above, according to the apparatus shown in FIG. 1, the deposition, reformation, and crystallization, which have different process temperatures, are performed in series in the single process chamber 5. At this time, under the control of the controller 27, the applied power to the heating lamps 30 is changed, while different distances are correspondingly set between the showerhead 10 and worktable 28 (wafer W), and thus between the showerhead 10 and heating lamps 30. As a consequence, the surface temperature of the showerhead 10 is maintained at an essentially constant temperature of, e.g., 150° C.

According to the apparatus shown in FIG. 1, it is possible to considerably reduce the probability that byproduct films sticking to the surface of the showerhead 10 peel off and produce particles. Since a plurality of processes are performed in series in the single process chamber 5, the time needed for transferring wafers is obviated, thereby improving the throughput. Since the number of process chambers is reduced, the installation cost is lowered that much.

In the embodiment described above, the surface temperature of the showerhead 10 is controlled to be constant at about 150° C., as a typical example for the sake of simplicity in understanding the present invention. However, in practice, even where the temperature changes within a certain temperature range, such as about ±50° C., it is possible to sufficiently reduce the probability that the byproduct films peel off due to this temperature change. Accordingly, for example, where the process temperature difference between the reformation and crystallization is very small, these processes may be performed with the same wafer position (the worktable position), such as the middle position or lowered position shown in FIG. 3, or apposition therebetween. In other words, the height positions of the worktable and heating lamps in the reformation and crystallization can be arbitrarily varied, as long as the temperature change due to this falls within a range of ±50° C. relative to the temperature of the showerhead 10 in the deposition.

Figure 4:
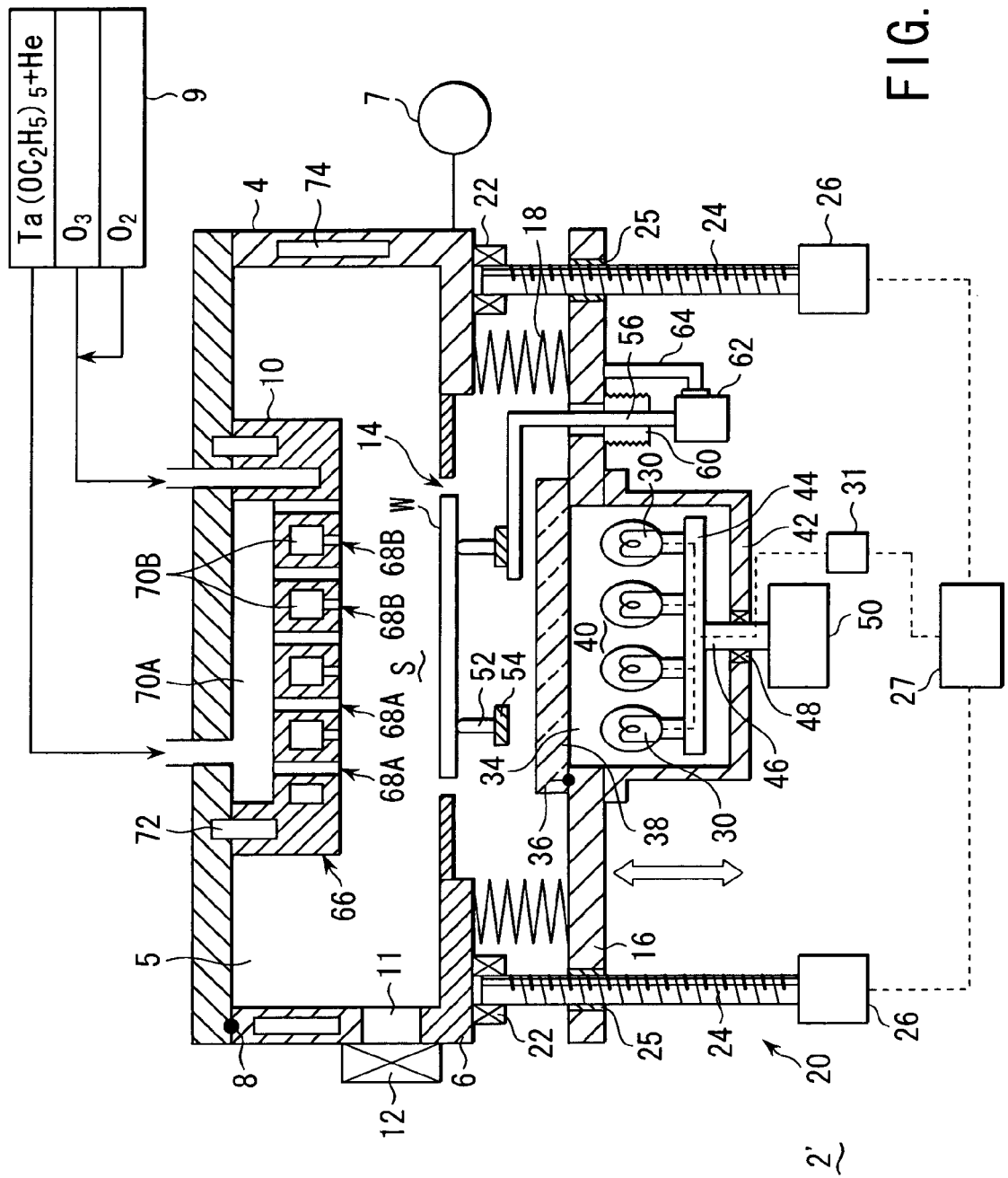
FIG. 4 is a structural diagram showing a single wafer thermal processing apparatus for a semiconductor process according to another embodiment of the present invention.

FIG. 4 is a structural diagram showing a single wafer thermal processing apparatus for a semiconductor process according to another embodiment of the present invention. The apparatus 2' according to this embodiment is similar to the apparatus 2 shown in FIG. 1, but has no worktable 28. In place of the worktable 28, lifter pins 52 for assisting load and unload are used as a support member for performing processes. When a wafer W is subjected to deposition, reformation and crystallization, the wafer W is supported by the three lifter pins 52, which are in point contact with its bottom. The light from heating lamps 30 is directly radiated onto the bottom of the wafer W.

Also in the apparatus 2' shown in FIG. 4, when the deposition, reformation and crystallization are performed, the distance between the showerhead 10 and heating lamps 30 is changed in three steps. This is conceived to allow the temperature change on the surface of the showerhead 10 (the bottom and side surfaces) to fall within a predetermined range, and preferably, to minimize it. For this, as in the apparatus 2 shown in FIG. 1, a bottom plate 16 is moved up and down by an elevator mechanism 20, so that the lifter pins 52 and heating lamps 30 are moved up and down together. As a consequence, the apparatus shown in FIG. 4 provides the same effects as the apparatus shown in FIG. 1.

Figure 5:
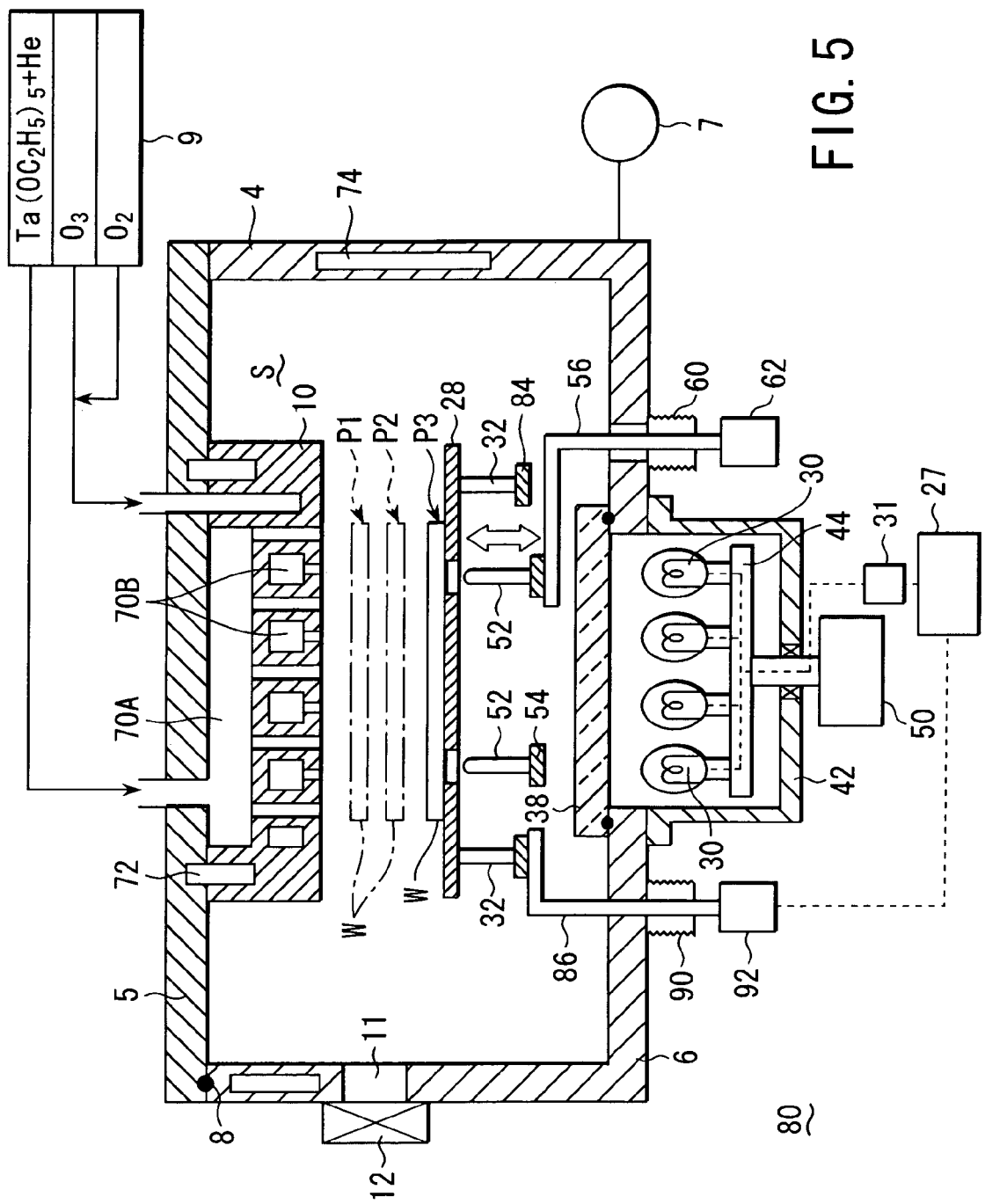
FIG. 5 is a structural diagram showing a single wafer thermal processing apparatus for a semiconductor process according to still another embodiment of the present invention.

FIG. 5 is a structural diagram showing a single wafer thermal processing apparatus for a semiconductor process according to still another embodiment of the present invention. The apparatus 80 according to this embodiment has a process chamber 5, whose bottom is formed of a fixed container bottom 6. A transmitting window 38 and heating lamps 30 are fixed to the container bottom 6. On the other hand, a worktable 28 for placing a wafer W thereon is not fixed to the container bottom 6, but is arranged movable up and down. Specifically, the worktable 28 is supported by a plurality of struts 32, which are connected to each other at their bottom by, e.g., an annular connection member 84 made of quartz, so that they are moved up and down together. The connection member 84 is fixed to the top of an elevator rod 86, which vertically extends through the container bottom 6. Where the elevator rod 86 moves up and down, the worktable 28 is moved up and down relative to the container bottom 6. Lifter pins 52 longer than those shown in FIG. 1 are disposed to obtain a longer stroke in vertical directions.

An extensible/contractible bellows 90 is disposed at the portion where the elevator rod 86 penetrates the container bottom 6 to ensure that the interior of the process chamber 5 is airtight. The bottom end of the elevator rod 86 is connected to an actuator 92 for moving the rod 86 up and down. The actuator 92 is fixed to a fixation base (not shown). The actuator 92 is driven along with a power supply 31 for the heating lamps 30, under the control of the controller 27.

Figure 6:
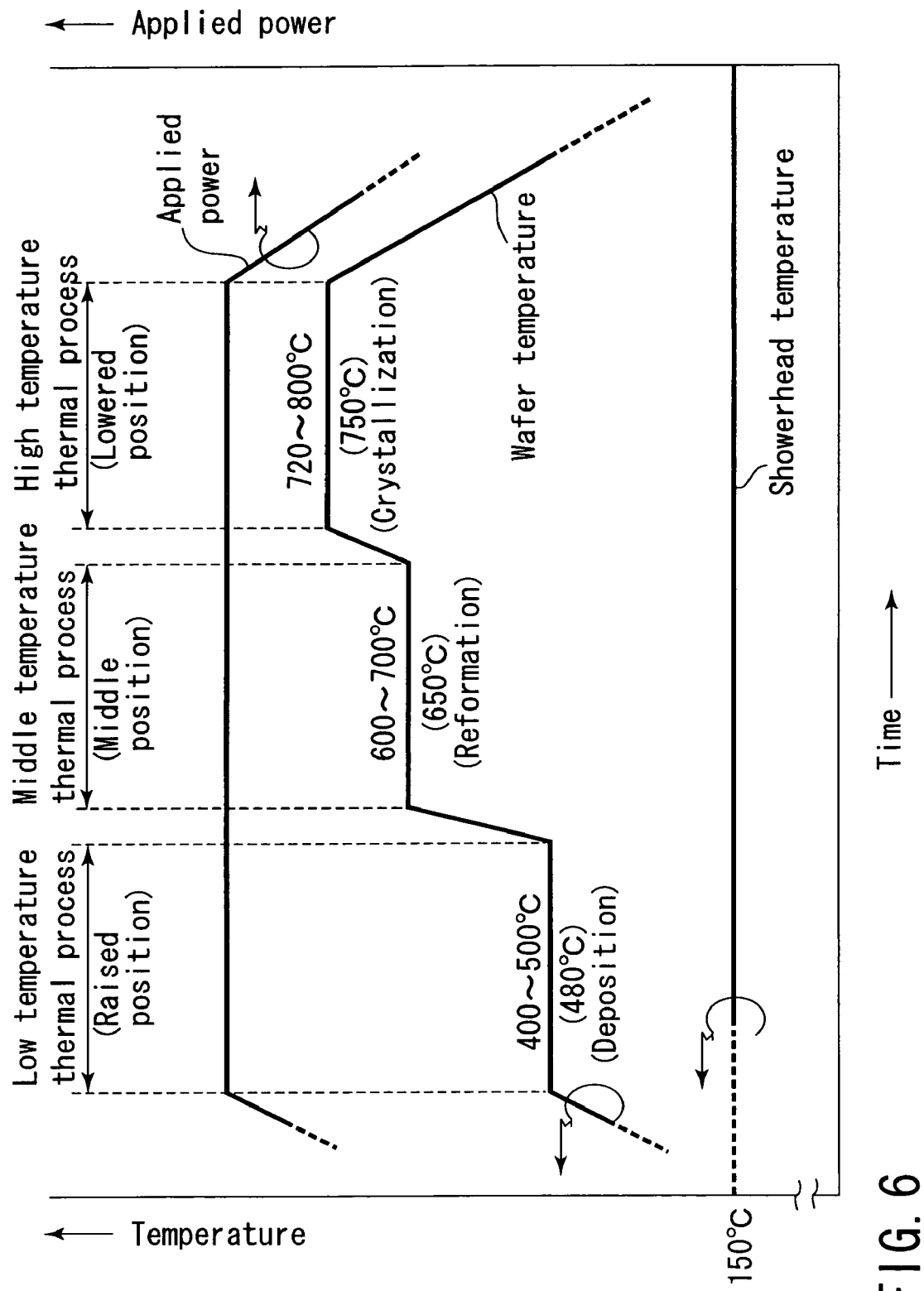
FIG. 6 is a graph showing the relationship between thermal processes having different process temperatures (wafer temperatures) and the applied power to heating lamps, in the apparatus shown in FIG. 5.

In the apparatus shown in FIG. 5, the worktable 28 is moved up and down, so that the distance between the heating lamps 30 and wafer W is changed in accordance with different process temperatures. Specifically, the wafer W is placed at positions P1, P2, and P3 shown in FIG. 5, in deposition, reformation, and crystallization, respectively. The positions P1, P2, and P3 correspond to the raised position shown in FIG. 2A, the middle position shown in FIG. 2B, and the lowered position shown in FIG. 2C, respectively. FIG. 6 is a graph showing the relationship between the thermal processes having different process temperatures (wafer temperatures) and the applied power to the heating lamps, in the apparatus shown in FIG. 5.

As shown in FIG. 6, the applied power to the heating lamps 30 is kept essentially constant, while the distance between the heating lamps 30 and wafer W is changed to set process temperatures in the deposition, reformation, and crystallization. The partition wall 42 of a heating chamber is fixed to the container bottom 6, and thus the distance between the heating lamps 30 and showerhead 10 is kept constant. As a consequence, the surface temperature of the showerhead 10 is maintained at an essentially constant temperature of, e.g., 150° C.

According to the apparatus shown in FIG. 5, it is possible to considerably reduce the probability that byproduct films sticking to the surface of the showerhead 10 peel off and produce particles. Since a plurality of processes are performed in series in the single process chamber 5, the time needed for transferring wafers is obviated, thereby improving the throughput. Since the number of process chambers is reduced, the installation cost is lowered that much.

Also in this case, a temperature change of the showerhead 10 is permissible if it falls within a range of about ±50° C. Furthermore, the applied power to the heating lamps 30 may be changed, such that the temperature change of the showerhead 10 falls with the permissible range.

Figure 7:
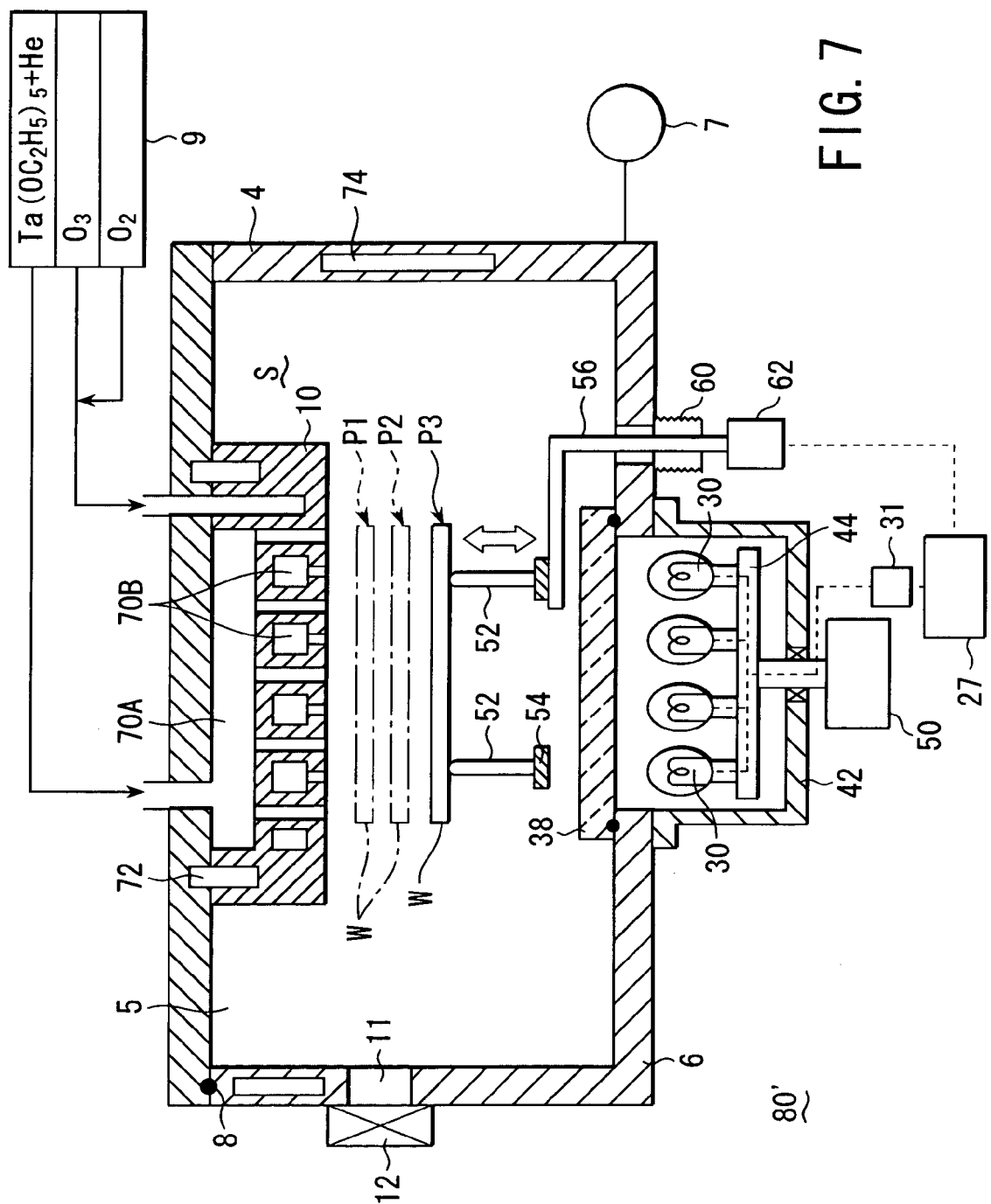
FIG. 7 is a structural diagram showing a single wafer thermal processing apparatus for a semiconductor process according to still another embodiment of the present invention.

FIG. 7 is a structural diagram showing a single wafer thermal processing apparatus for a semiconductor process according to still another embodiment of the present invention. The apparatus 80' according to this embodiment is similar to the apparatus 80 shown in FIG. 5, but has no worktable 28. In place of the worktable 28, lifter pins 52 for assisting load and unload are used as a support member for performing processes. When a wafer W is subjected to deposition, reformation and crystallization, the wafer W is supported by the three lifter pins 52, which are in point contact with its bottom. The light from heating lamps 30 is directly radiated onto the bottom of the wafer W.

Also in the apparatus 80' shown in FIG. 7, when the deposition, reformation and crystallization are performed, the distance between the wafer W and heating lamps 30 is changed in three steps, while the applied power to the heating lamps 30 is kept essentially constant. This is conceived to allow the temperature change on the surface of the showerhead 10 (the bottom and side surfaces) to fall within a predetermined range, and preferably, to minimize it. For this, an actuator 62 for the lifter pins 52 is driven along with a power supply 31 for the heating lamps 30, under the control of a controller 27, so that the wafer W is moved up and down by the lifter pins 52, in place of the worktable 28. As a consequence, the apparatus shown in FIG. 7 provides the same effects as the apparatus shown in FIG. 5.

In the embodiments described above, an explanation is given of an example where a tantalum oxide film is formed as a metal oxide film. The present invention, however, may be applied to a process of forming another metal oxide film, such as a titanium oxide film, zirconium oxide film, barium oxide film, or strontium oxide film. In this case, a metal alkoxide of the corresponding metal is used as a raw material. Furthermore, the present invention may be applied to a process of forming a niobium oxide film, hafnium oxide film, yttrium oxide film, or lead oxide film, as well as metal oxide films described above.

The present invention is not limited by the embodiments described above, and can be practiced in various embodiments without departing from the spirit and scope of the invention. The features of the embodiments described above can be arbitrarily combined with each other in practice, thereby obtaining combined effects.

The invention claimed is:

1. A single substrate thermal processing apparatus for subjecting a target substrate to a plurality of semiconductor processes having different process temperatures, comprising:

a process chamber configured to accommodate a target substrate;

a supply system configured to supply a process gas into the process chamber, the supply system including a showerhead, which is disposed on a ceiling of the process chamber and has a bottom surface with a plurality of spouting holes for spouting a process gas;

an exhaust system configured to vacuum-exhaust the process chamber;

a support member configured to support the target substrate to face the showerhead in the process chamber when the target substrate is subjected to the semiconductor processes;

a heating lamp disposed below the support member, and configured to emit light to heat the target substrate; and an elevator mechanism configured to move the support member and the heating lamp up and down together relative to the showerhead, the elevator mechanism being configured to set different distances between the showerhead and the heating lamp, in accordance with the different process temperatures, thereby causing temperature change of the bottom surface of the showerhead to fall in a predetermined range.

2. The apparatus according to claim 1, wherein the process chamber comprises a container having a bottom with a first opening formed therein, a bottom plate disposed to cover the first opening and movable up and down relative to the container, and an extensible/contractible connection member airtightly connecting the container and the bottom plate to each other, the support member and the heating lamp are supported by the bottom plate, and the elevator mechanism moves the bottom plate up and down.

3. The apparatus according to claim 2, wherein the bottom plate is provided with a second opening formed therein and airtightly closed by a transmitting window, which allows light emitted from the heating lamp to pass therethrough, and the support member and the heating lamp are disposed inside and outside the process chamber, respectively, and face each other with the transmitting window interposed therebetween.

4. The apparatus according to claim 2, wherein the connection member comprises a bellows.

5. The apparatus according to claim 1, wherein the support member comprises a worktable configured to come into contact with a substantially entire bottom surface of the target substrate.

6. The apparatus according to claim 5, further comprising a plurality of lifter pins configured to assist load and unload of the target substrate relative to the worktable, while projecting upward from lifter holes formed in the worktable, and a drive mechanism configured to drive the lifter pins, wherein the elevator mechanism moves the support member, the heating lamp, and the drive mechanism up and down together.

7. The apparatus according to claim 1, wherein the support member comprises a plurality of lifter pins configured to come into point contact with a bottom surface of the target substrate.

8. The apparatus according to claim 1, further comprising a controller configured to set different distances between the showerhead and the heating lamp by the elevator mechanism, in accordance with signals representing light energy emitted from the heating lamp, thereby causing temperature change of the bottom surface of the showerhead to fall in a predetermined range.

9. The apparatus according to claim 8, wherein the signals representing light energy are applied power to the heating lamp.

10. The apparatus according to claim 8, wherein the controller is configured to set first, second, and third distances between the showerhead and the heating lamp by the elevator mechanism, the second distance being larger than the first distance and smaller than the third distance, in accordance with a first process temperature for depositing a metal oxide film on the target substrate, a second process temperature higher than the first process temperature and for reforming the metal oxide film, and a third process temperature higher than the second process temperature and for crystallizing the metal oxide film, respectively.

11. A single substrate thermal processing apparatus for subjecting a target substrate to a plurality of semiconductor processes having different process temperatures, comprising:

a process chamber configured to accommodate a target substrate;

a supply system configured to supply a process gas into the process chamber, the supply system including a showerhead, which is disposed on a ceiling of the process chamber and has a bottom surface with a plurality of spouting holes for spouting a process gas;

an exhaust system configured to vacuum-exhaust the process chamber;

a support member configured to support the target substrate to face the showerhead in the process chamber when the target substrate is subjected to the semiconductor processes;

a heating lamp disposed below the support member, and configured to emit light to heat the target substrate; and an elevator mechanism configured to move the support member up and down, the elevator mechanism being configured to set different distances between the target substrate and the heating lamp, in accordance with the different process temperatures, thereby causing temperature change of the bottom surface of the showerhead to fall in a predetermined range.

12. The apparatus according to claim 11, wherein the support member comprises a worktable configured to come into contact with a substantially entire bottom surface of the target substrate.

13. The apparatus according to claim 11, wherein the support member comprises a plurality of lifter pins configured to come into point contact with a bottom surface of the target substrate.

14. The apparatus according to claim 11, further comprising a controller configured to set first, second, and third distances between the target substrate and the heating lamp by the elevator mechanism, the second distance being smaller than the first distance and larger than the third distance, in accordance with a first process temperature for depositing a metal oxide film on the target substrate, a second process temperature higher than the first process temperature and for reforming the metal oxide film, and a third process temperature higher than the second process temperature and for crystallizing the metal oxide film, respectively.

* * * * *